United States Patent
Brousseau, III

(10) Patent No.: US 6,673,717 B1
(45) Date of Patent: Jan. 6, 2004

(54) METHODS FOR FABRICATING NANOPORES FOR SINGLE-ELECTRON DEVICES

(75) Inventor: Louis C. Brousseau, III, Austin, TX (US)

(73) Assignee: Quantum Logic Devices, Inc., Austin, TX (US)

(*) Notice: Subject to any disclaimer, the term of this patent is extended or adjusted under 35 U.S.C. 154(b) by 0 days.

(21) Appl. No.: 10/180,572

(22) Filed: Jun. 26, 2002

(51) Int. Cl.$^7$ .................. H01L 21/44; H01L 21/336
(52) U.S. Cl. .................. 438/674; 438/301; 438/962
(58) Field of Search .................. 438/674, 94, 301, 438/302, 118, 149, 962

(56) References Cited

U.S. PATENT DOCUMENTS

| | | | |
|---|---|---|---|
| 4,777,019 A | 10/1988 | Dandekar | |
| 4,778,769 A | 10/1988 | Forrest et al. | |
| 4,877,582 A | 10/1989 | Oda et al. | |
| 4,894,339 A | 1/1990 | Hanazato et al. | |
| 5,039,390 A | 8/1991 | Hampp et al. | |
| 5,219,577 A | 6/1993 | Kossovsky et al. | |
| 5,420,746 A | 5/1995 | Smith | |
| 5,576,563 A | 11/1996 | Chung | |
| 5,653,939 A | 8/1997 | Hollis et al. | |
| 5,747,839 A | 5/1998 | Hammond et al. | |
| 5,844,834 A | 12/1998 | Risch et al. | |
| 5,892,252 A | 4/1999 | Hammond et al. | |
| 5,899,734 A | 5/1999 | Lee | |
| 5,900,728 A | 5/1999 | Moser et al. | |
| 5,900,729 A | 5/1999 | Moser et al. | |
| 5,922,537 A | 7/1999 | Ewart et al. | |
| 5,989,947 A | 11/1999 | Dilger et al. | |
| 5,997,958 A | 12/1999 | Sato et al. | |
| 6,040,605 A * | 3/2000 | Sano et al. | 257/369 |
| 6,057,556 A | 5/2000 | Gubin et al. | |
| 6,060,723 A * | 5/2000 | Nakazato et al. | 257/20 |
| 6,060,743 A * | 5/2000 | Sugiyama et al. | 438/962 |
| 6,066,265 A | 5/2000 | Galvin et al. | |
| 6,103,868 A | 8/2000 | Heath et al. | |
| 6,121,075 A | 9/2000 | Yamashita | |
| 6,159,620 A | 12/2000 | Heath et al. | |
| 6,194,759 B1 * | 2/2001 | Sano et al. | 257/314 |
| 6,211,531 B1 * | 4/2001 | Nakazato et al. | 257/28 |
| 6,503,831 B2 * | 1/2003 | Speakman | 438/674 |
| 6,524,883 B2 * | 2/2003 | Kim | 438/94 |

FOREIGN PATENT DOCUMENTS

| | | |
|---|---|---|
| WO | WO 93-08464 | 4/1993 |
| WO | WO 99/61911 | 12/1999 |
| WO | WO 01/13432 | 2/2001 |

OTHER PUBLICATIONS

Lenigk et al., *Surface Characterization of a Silicon–Chip–Based DNA Microarray*, Langmuir, 2001, pp. 2497–2501.

Rangelow et al., *Fabrication and Electrical Characterization of High Aspect Ratio Silicon Field Emitter Arrays*, J. Vac. Sci. Technol. B, vol. 19, No. 3, pp. 916–919.

(List continued on next page.)

*Primary Examiner*—John F. Niebling
*Assistant Examiner*—Walter L. Lindsay, Jr.
(74) *Attorney, Agent, or Firm*—Myers Bigel Sibley & Sajovec

(57) ABSTRACT

Nanopores for single-electron devices may be used as templates for placing of a desired number of nanoparticles at a desired location in the devices. Nanopores may be fabricated by providing on a substrate spaced apart electrode regions, a spacer region therebetween, and a cover layer on the spaced apart electrode regions and on the spacer region. A wet etching solution is contacted to the cover-layer. At least one of the spaced apart electrode regions is energized, to selectively wet etch the cover layer adjacent the spacer region and define a nanopore in the cover layer adjacent the spacer region. At least one nanoparticle is placed in the nanopore. Accordingly, nanopores can be aligned to a buried spacer region.

20 Claims, 3 Drawing Sheets

OTHER PUBLICATIONS

Dziuban et al., *Mold–Type Field–Emission Array Fabrication by the Use of Fast Silicon Etching*, J. Vac. Sci. Technol. B, vol. 19, No. 3, May/Jun. 2001, pp. 897–899.

International Search Report, PCT/US00/22747, Dec. 21, 2000.

Letsinger et al., *Use of a Steroid Cyclic Disulfide Anchor in Constructing Gold Nanoparticle–Oligonucleotide Conjugates*, Bioconjugate Chem., 2000, vol. 11, pp. 289–291.

Taylor et al., *Probing Specific Sequences on Single DNA Molecules With Bioconjugated Fluorescent Nanoparticles*, Analytical Chemistry, vol. 72, No. 9, May 1, 2000, pp. 1979–1986.

Chan et al., *Quantum Dot Bioconjugates for Ultrasensitive Nonisotopic Detection*, Science, vol. 281, Sep. 25, 1998, pp. 2016–2018.

Bruchez, Jr. et al., *Semiconductor Nanocrystals as Fluorescent Biological Labels*, Science, vol. 281, Sep. 25, 1998, pp. 2013–2016.

Brousseau, III et al., *pH–Gated Single–Electron Tunneling in Chemically Modified Gold Nanoclusters*, Journal of the American Chemical Society, vol. 120, No. 30, 1998, pp. 7645–7646.

Feldheim et al., *Self–Assembly of Single Electron Transistors and Related Devices*, Chemical Society Reviews, vol. 27, 1998, pp. 1–12.

Masuda et al., *Highly Ordered Nanochannel–Array Architecture in Anodic Alumina*, Appl. Phys. Lett. vol. 17, No. 19, Nov. 10, 1997, pp. 2770–2772.

Klein et al., entitled *A Single–Electron Transistor Made From a Cadmium Selenide Nanocrystal*, Nature, 1997, pp. 699–701.

Elghanian et al., *Selective Colorimetric Detection of Polynucleotides Based on the Distance–Dependent Optical Properties of Gold Nanoparticles*, Science, vol. 277, Aug. 22, 1997, pp. 1078–1081.

Yoo et al., *Scanning Single–Electron Transistor Microscopy: Imaging Individual Charges*, Science, vol. 276, Apr. 25, 1997, pp. 579–582.

Abstract, Andres et al., *"Coulomb Staircase" Single Electron Tunneling at Room Temperature in a Self Assembled Molecular Nanostructure*, Science, 1996, vol. 272, pp. 1323–1325.

Ulman, entitled *Formation and Structure of Self–Assembled Monolayers*, Chemical Review, 1996, pp. 1533–1554.

Snow et al., *Fabrication of Si Nanostructures With an Atomic Force Microscope*, Appl. Phys. Lett., vol. 64, No. 15, Apr. 11, 1994, pp. 1932–1934.

Dagata et al., *Modification of Hydrogen–Passivated Silicon by a Scanning Tunneling Microscope Operating in Air*, Appl. Phys. Lett., vol. 56, No. 20, May 14, 1990, pp. 2001–2003.

Sze, *Semiconductor Devices Physics and Technology*, John Wiley & Sons, 1985, pp. 200–210.

Brousseau III, U.S. application Ser. No. 09/905,471, Jul. 13, 2001.

Brousseau III, U.S. application Ser. No. 09/905,319, Jul. 13, 2001.

* cited by examiner

METHODS FOR FABRICATING NANOPORES FOR SINGLE-ELECTRON DEVICES

FIELD OF THE INVENTION

This invention relates to microelectronic devices and fabrication methods and systems therefor, and more particularly to single-electron devices and fabrication methods and systems therefor.

BACKGROUND OF THE INVENTION

Single-Electron Transistor (SET) devices and fabrication methods and systems are being widely investigated for high density and/or high performance microelectronic devices. As is well known to those having skill in the art, single-electron transistors use single-electron nanoelectronics that can operate based on the flow of single-electrons through nanometer-sized particles, also referred to as nanoparticles, nanoclusters or quantum dots. Although a single-electron transistor can be similar in general principle to a conventional Field Effect Transistor (FET), such as a conventional Metal Oxide Semiconductor FET (MOSFET), in a single-electron transistor, transfer of electrons may take place based on the tunneling of single-electrons through the nanoparticles. Single-electron transistors are described, for example, in U.S. Pat. Nos. 5,420,746; 5,646,420; 5,844,834; 6,057,556 and 6,159,620, and in publications by the present inventor Brousseau, III et al., entitled *pH-Gated Single-Electron Tunneling in Chemically Modified Gold Nanoclusters*, Journal of the American Chemical Society, Vol. 120, No. 30, 1998, pp. 7645-7646, and by Feldheim et al., entitled *Self-Assembly of Single-electron Transistors and Related Devices, Chemical* Society Reviews, Vol. 27, 1998, pp. 1–12, and in a publication by Klein et al., entitled *A Single-Electron Transistor Made From a Cadmium Selenide Nanocrystal*, Nature, 1997, pp. 699–701, the disclosures of which are hereby incorporated herein by reference in their entirety as if set forth fully herein.

A major breakthrough in single-electron transistor technology is described in U.S. patent application Ser. No. 09/376,695, entitled *Sensing Devices Using Chemically-Gated Single-electron Transistors*, by Daniel L. Feldheim and the present inventor Louis C. Brousseau, III, also published as International Publication No. WO 01/13432 A1, the disclosures of which are hereby incorporated herein by reference in their entirety as if set forth fully herein. Described therein is a chemically-gated single-electron transistor that can be adapted for use as a chemical or biological sensor. Embodiments of these chemically-gated single-electron transistors include source and drain electrodes on a substrate and a nanoparticle between the source and drain electrodes, that has a spatial dimension of a magnitude of approximately 12 nm or less. An analyte-specific binding agent is disposed on a surface of the nanoparticle. A binding event occurring between a target analyte and the binding agent causes a detectable change in the characteristics of the single-electron transistor.

Other single-electron devices, including but not limited to resonant tunneling diodes and nonvolatile memory cells, also are being investigated. However, it may be difficult to fabricate single-electron devices using conventional photolithography that is employed to fabricate microelectronic devices. For example, in order to provide quantum mechanical effects with nanoparticles, it may be desirable to provide spacing between the source and drain electrodes of a single-electron transistor that is less than about 20 nm, or less than about 12 nm or about 10 nm. It also may be desirable to accurately place one or more nanoparticles with respect to this spacing. It may be difficult, however, to provide these spacings and/or to place these nanoparticles using conventional lithography at low cost and/or with acceptable device yields.

SUMMARY OF THE INVENTION

Embodiments of the present invention provide methods and systems for fabricating nanopores for single-electron devices and single-electron devices that include nanopores. The nanopores may be used as templates for placing of a desired number and/or type of nanoparticles at a desired location in the devices.

More specifically, single-electron devices may be fabricated, according to some embodiments of the present invention, by providing on a substrate, a plurality of spaced apart electrode regions, a spacer region therebetween, and a cover layer on the spaced apart electrode regions and on the spacer region. A wet etching solution is contacted to the cover layer. At least one of the spaced apart electrode regions is energized, to selectively wet etch the cover layer adjacent the spacer region and define a nanopore in the cover layer adjacent the spacer region. At least one nanoparticle is placed in the nanopore. In some embodiments, the spacer region is less than about 20 nm thick, and the nanopore is less than about 20 nm wide. In other embodiments, the nanopore is about 10 nm wide and about 10 nm thick. Accordingly, some embodiments of the present invention can allow small dimensioned nanopores to be aligned to a buried spacer region.

In some embodiments of the invention, the etching solution is an acid or a base. In other embodiments, the base is a weak base solution having a pH of less than about 14. In yet other embodiments, the weak base solution comprises an amine. In still other embodiments, the weak base solution comprises ethylene diamine and/or triethylamine. In other embodiments, the acid is sulfuric acid and/or phosphoric acid. Other acidic or basic etching solutions may be used.

Still other embodiments provide a counter electrode that is adjacent and spaced apart from the spacer regions and contact the wet etching solution to the cover layer and to the counter electrode. At least one of the spaced apart electrode regions and the counter electrode is energized to selectively wet etch the cover layer adjacent the spacer region and define the nanopore in the cover layer adjacent the spacer region. In other embodiments, the counter electrode and at least one of the spaced apart electrode regions are energized by applying a Direct Current (DC) voltage therebetween. In yet other embodiments, an Alternating Current (AC) voltage is used.

In some embodiments of the present invention, the plurality of spaced apart electrode regions and the spacer region therebetween may be provided on a substrate using conventional photolithography techniques. Other embodiments of the invention can provide a plurality of spaced apart electrode regions and a spacer region therebetween using methods and structures that are described in application Ser. No. 09/905,319, to Brousseau, III, filed Jul. 13, 2001, and entitled *Single-Electron Transistors and Fabrication Methods in Which the Thickness of An Insulating Layer Defines Spacing Between Electrodes*, the disclosure of which is hereby incorporated herein by reference in its entirety as if set forth fully herein. In particular, in some of these embodiments, a first electrode is formed on the substrate. An insulating layer is conformally formed on the first electrode. A second electrode is conformally formed on the insulating layer opposite the first electrode, such that the first electrode and the second electrode define the plurality of spaced apart electrode regions and the insulating layer therebetween defines the spacer region. Still other embodiments can provide the plurality of spaced apart electrode regions and the spacer region therebetween using structures and methods that are described in application Ser. No. 09/905,471, to Brousseau, III, filed Jul. 13, 2001, and entitled *Single-Electron Transistors and Fabrication Methods in Which a Projecting Feature Defines Spacing Between Electrodes*, the disclosure of which is hereby incorporated herein by reference in its entirety as if set forth fully herein. In some of these embodiments, a projecting feature is formed on a substrate that projects from a face thereof. A first electrode is formed on the projecting feature. A second electrode is formed on the projecting feature and is spaced apart from the first electrode, such that the first electrode and the second electrode define the plurality of spaced apart electrode regions and the projecting feature therebetween defines the spacer region. The projecting feature can project inwardly or outwardly from the face.

Embodiments of the present invention may be used to fabricate many types of single-electron devices. In some embodiments, an outer electrode region is formed on the layer and extends across the nanopore. These embodiments can provide a single-electron transistor, wherein the plurality of spaced apart electrode regions define a source electrode and a drain electrode, and wherein the outer electrode region defines a gate electrode. In some of these embodiments, the at least one nanoparticle can comprise at least one metal nanoparticle in the nanopore. Other nanoparticle(s) also may be used.

In other embodiments, the single-electron device is a resonant tunneling diode, and the plurality of spaced apart electrode regions are electrically connected together. In some embodiments of resonant tunneling diodes, the at least one nanoparticle comprises a first metal nanoparticle in the nanopore adjacent the spacer region, a semiconductor nanoparticle in the nanopore on the first metal nanoparticle opposite the spacer region and a second metal nanoparticle in the nanopore on the semiconductor nanoparticle opposite the first metal nanoparticle. Other configurations also may be used.

Still other embodiments can provide a nonvolatile memory cell. In some of these embodiments, the at least one nanoparticle comprises a first semiconductor nanoparticle in the nanopore adjacent the spacer region, a metal nanoparticle in the nanopore on the first semiconductor nanoparticle opposite the spacer region and a second semiconductor nanoparticles in the nanopore on the metal nanoparticle opposite the first semiconductor nanoparticle. Other configurations may be used. Moreover, other single electron devices such as optoelectronic devices also may be fabricated.

Single-electron devices according to some embodiments of the invention can include a substrate, a plurality of spaced apart electrode regions, a spacer region therebetween on the substrate, and a cover layer on the spaced apart electrode regions and on the spacer region. The cover layer contains therein a nanopore adjacent the spacer region that is less than about 20 nm wide and less than about 20 nm deep. At least one nanoparticle is provided in the nanopore. Embodiments of the plurality of spaced apart electrode regions and the spacer region therebetween may be provided as were described above. Single-electron transistors, resonant tunneling diodes and nonvolatile memory cells may be provided as was described above.

Intermediate product single-electron devices according to some embodiments of the present invention can comprise a substrate, a plurality of spaced apart electrode regions and a spacer region therebetween, on the substrate, and a cover layer on the spaced apart electrode regions and on the spacer region. The cover layer contains therein a nanopore adjacent the spacer region that is less than about 20 nm wide, and less than about 20 nm deep. A wet etching solution contacts the cover layer including the nanoparticle. Embodiments of the spaced apart electrode regions and the spacer region therebetween may be provided as were described above. Embodiments of the wet etching solution that were described above also may be provided. A counter electrode also may be provided as was described above.

Finally, systems for fabricating single-electron devices also may be provided. In some embodiments, these systems comprise a substrate holder that is configured to hold a substrate that includes a plurality of spaced apart electrode regions, a spacer region therebetween, and a cover layer on the spaced apart electrode regions and on the spacer region. A wet etching solution container is configured to contact a wet etching solution to the cover layer. A controller is configured to energize at least one of the spaced apart electrode regions, to selectively wet etch the cover layer adjacent the spacer region, and define a nanopore in the cover layer adjacent the spacer region. A counter electrode also may be provided that contacts the wet etching solution and that also is controlled by the controller. A subsystem also may be provided to place at least one nanoparticle in the nanopore.

DETAILED DESCRIPTION OF PREFERRED EMBODIMENTS

Figure 1A:
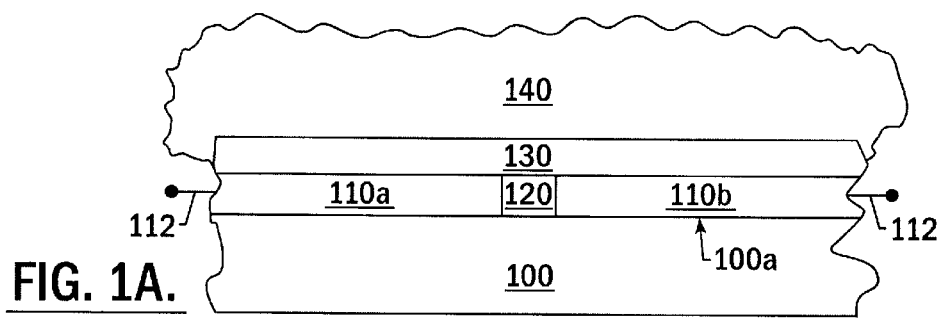
FIGS. 1A–1F, 2, 3A–3B, 4A–4B and 5A–5B are cross-sectional views of single electron devices, according to various embodiments of the present invention, during intermediate fabrication steps according to various embodiments of the present invention.

The present invention now will be described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

FIGS. 1A–1F are cross-sectional views of single-electron devices according to some embodiments of the present invention during intermediate fabrication steps according to some embodiments of the present invention. Referring now to FIG. 1A, the single-electron device includes a substrate 100, a plurality, here two, of spaced apart electrode regions 110a, 110b on a face 100a thereof, and a spacer region 120 therebetween.

As is well known to those having skill in the art, the substrate 100 can comprise a conventional monocrystalline silicon substrate, a semiconductor-on-insulator (SOI) substrate, a silicon carbide gallium arsenide, gallium nitride, diamond thin film and/or other substrate, and may also include one or more heteroepitaxial and/or homoepitaxial layers on the substrate. The substrate face 100a may be planar or nonplanar (three-dimensional). The spaced apart electrode regions 110a, 110b may be formed of a single conductive layer, such as a metal layer that is patterned using high resolution photolithography to define a spacer region 120. In some embodiments, in order to provide quantum mechanical effects with nanoparticles, it may be desirable for the spacer region to be less than about 20 nm wide. In other embodiments, the spacer region 120 is less than about 12 nm wide. In still other embodiments, the spacer region 120 is about 10 nm wide. Other embodiments of the invention that will be described below may be used to fabricate these closely spaced first and second electrode regions. 10a and 110b, without the need to use lithography to define the spacer region 120. It will also be understood that the spacer region may contain an insulating material such as silicon dioxide, silicon nitride and/or other conventional insulating materials. In other embodiments, the spacer region 120 may be partially or wholly unfilled.

Continuing with the description of FIG. 1A, a cover layer 130 is formed on the spaced apart electrode regions 110a and 110b and on the spacer region 120. The cover layer 130 may be less than about 20 nm thick in some embodiments, less than about 12 nm thick in other embodiments, and about 10 nm thick in still other embodiments of the invention.

In some embodiments, the first and second electrode regions 110a and 110b may be conductive or may include a portion thereof that is conductive adjacent the spacer region 120. The first and second electrode regions may comprise any of the materials that were described above for the substrate 100, and may also include other conductive materials, such as conductive polysilicon, metal and/or other conductive materials. The cover layer 130 may comprise silicon dioxide, silicon nitride, high dielectric constant material and/or other dielectric materials, or multiple sublayers thereof, that can be formed using conventional microelectronic processes, such as Plasma-Enhanced Chemical Vapor Deposition (PECVD), so that the cover layer 130 may be made relatively thin with high controllability and reliability. In other embodiments, the cover layer 130 may be formed using electro-chemical oxidation. In still other embodiments, the cover layer 130 can include one or more self-assembled monolayers and/or polymer films. In yet other embodiments, the cover layer 130 can comprise a metal that is anodized into an insulating layer, such as anodic aluminum oxide. Other embodiments also may be provided.

Still referring to FIG. 1A, in fabricating single-electron devices, it may be desirable to place one or more nanoparticles in a nanopore in the cover layer 130 that is aligned to the spacer region 120 beneath the cover layer 130. It may be desirable for the nanopore to have very small dimensions, such as less than about 20 nm in some embodiments, or less than about 12 nm in other embodiments, or about 10 nm in yet other embodiments, so that the nanopore can provide a template for placing one or more nanoparticles therein. It may be difficult to form this nanopore using conventional lithography techniques. Moreover, it also may be desirable for a nanopore that is formed in the cover layer 130 to be aligned to the first and second electrode regions 100a and 10b that are buried beneath the cover layer 130, and/or aligned to the spacer region 120 that is buried beneath the cover layer 130. Unfortunately, it may be difficult to provide this alignment to regions that are buried beneath the cover layer 130.

Figure 1B:
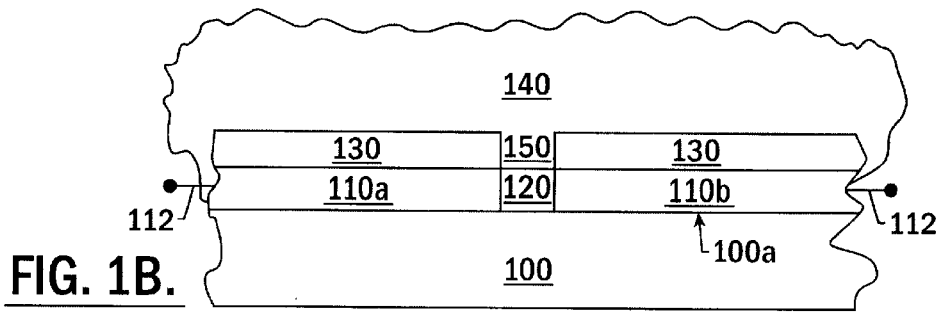

Still referring to FIG. 1A, according to some embodiments of the invention, a wet etching solution 140 is contacted to the cover layer 130. As also shown, at least one of the spaced apart electrode regions 110a, 110b is energized, for example using one or more terminals 112, to selectively wet etch the cover layer 130 adjacent the spacer region 120. As shown in FIG. 1B, the wet etching defines a nanopore 150 in the cover layer adjacent the spacer region 120.

In some embodiments of the present invention, the wet etching solution 140 comprises a base solution. In other embodiments, the base solution is a weak base solution having a pH of less than about 14. In still other embodiments, the base solution comprises an amine. In still other embodiments, the base solution comprises ethylene, diamine and/or triethyl amine. In still other embodiments of the invention, the base solution comprises ethylene diamine and/or triethyl amine at a concentration of 1 molar. In still other embodiments, an acidic solution may be used. In other embodiments, the acidic solution comprises sulfuric and/or phosphoric acid. In yet other embodiments, the at least one of the spaced apart electrode regions 110a, 110b is energized by applying a DC voltage to one or more of the electrode regions 110a, 110b, for example using terminals 112. In some embodiments, a DC voltage of about 10V may be applied. In yet other embodiments, an AC voltage is applied.

Accordingly, as shown in FIGS. 1A and 1B, some embodiments of the present invention can provide field strength dependent wet etching that can be used to define a nanopore that is aligned to a buried region. Field strength dependent wet etching has been used in other environments, and is described, for example, in Masuda et al., *Square and Triangular Nanohole Array Architectures in Anodic Alumina*, Advanced Materials, Vol. 13, No. 3, Feb. 5, 2001, pp. 189–192; Masuda et al., *Highly Ordered Nanochannel-Array Architecture in Anodic Alumina*, Applied Physics Letters, Vol. 71, No. 19, Nov. 10, 1997, pp. 2770–2772; Hockett et al., *A Convenient Method for Removing Surface Oxides From Tungsten STM Tips*, Review of Scientific Instruments, Vol. 64, No. 1, Jan. 1993, pp. 263–264; Dagata et al., *Modification of Hydrogen-Passivated Silicon By a Scanning Tunneling Microscope Operating in Air*, Applied Physics Letters, Vol. 56, No. 20, May 14, 1990, pp. 2001–2003; and Snow et al., *Fabrication of Si Nanostructures With An Atomic Force Microscope*, Applied Physics Letters, Vol. 64, No. 15, Apr. 11, 1994, pp. 1932–1934, the disclosures of which are hereby incorporated herein by reference in their entirety as if set forth fully herein.

Figure 1C:
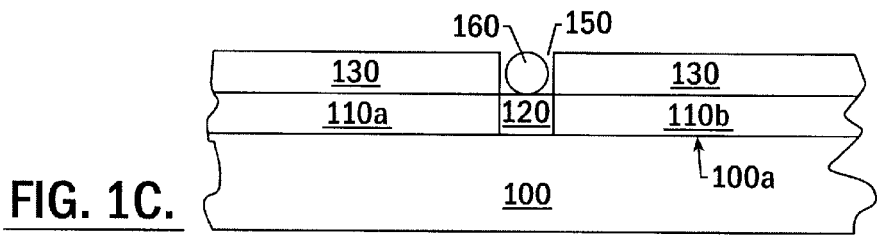

Referring now to FIG. 1C, at least one nanoparticle 160 is placed in the nanopore 150. The fabrication of at least one nanoparticle 160 is described, for example, in the above-incorporated Brousseau, III et al., Feldheim et al. and Klein et al. publications, and need not be described further herein. For example, a nanoparticle may be placed using a self-assembled hexane dithiol molecular tether. Other techniques, such as vacuum deposition (e.g. CVD) and/or electrochemical deposition may be used. Evaporation also may be used. In some embodiments, the nanoparticles have a diameter of less than about 100 nm. In other embodiments, a diameter of less than 20 nm may be provided. In still other embodiments, a diameter of about 10 nm may be provided.

Figure 1D:
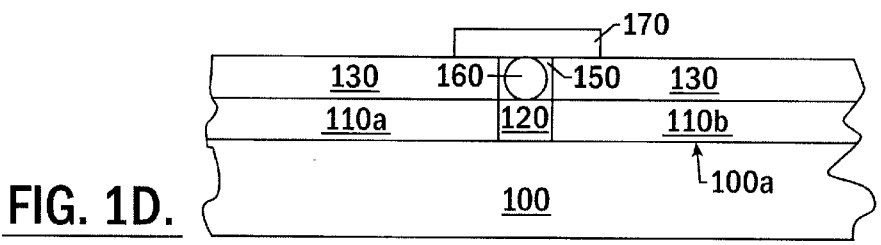

Referring now to FIG. 1D, an outer electrode region 170 may be formed on the cover layer 130 and extending across the nanopore 150. The outer electrode region 170 may comprise any of the materials that are used for the first and second electrodes 110*a* and 110*b*, and may be formed using deposition and photolithography and/or other conventional techniques. Embodiments of FIG. 1D may provide a single-electron transistor, wherein the first and second spaced apart electrode regions 110*a* and 110*b* define a source electrode and a drain electrode, and wherein the outer electrode region 170 defines a gate electrode. In these embodiments, the nanoparticle 160 may comprise at least one metal nanoparticle 160 in the nanopore 150. Other nanoparticle(s) may be used.

Figure 1E:
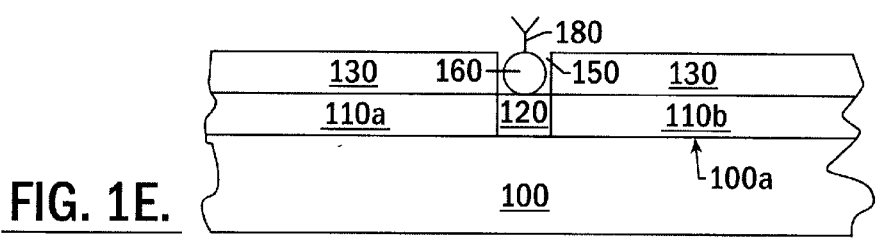

Referring now to FIG. 1E, structures of FIG. 1C also may provide a chemically-gated single-electron transistor, by forming an analyte-specific binding agent 180 on a surface of the at least one nanoparticle 160. Chemically-gated single-electron transistors are described in the above-cited U.S. patent application Ser. No. 09/376,695 and International Publication No. WO 01/13432 A1, and need not be described further herein.

Figure 1F:
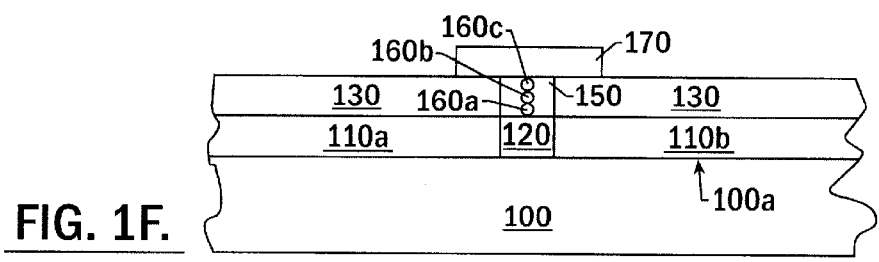

Referring now to FIG. 1F, structures of FIG. 1C also may be used to fabricate resonant tunneling diodes and/or non-volatile memory cells. In particular, in FIG. 1F, a plurality, here three, of nanoparticles 160*a*–160*c* are stacked within the nanopore 150. The small dimensions of the nanopore can facilitate the stacking of the nanoparticles 160*a*–160*c*.

Embodiments of FIG. 1F may be used to provide resonant tunneling diodes and/or nonvolatile memory cells. When a resonant tunneling diode is provided, the first and second spaced apart electrode regions 110*a* and 110*b* are electrically connected together, to provide, for example, an anode of the resonant tunneling diode, and the outer electrode region 170 can provide, for example, a cathode of the resonant tunneling diode. In some embodiments of resonant tunneling diodes, the first nanoparticle 160*a* comprises a first metal nanoparticle, the second nanoparticle 160*b* comprises a semiconductor nanoparticle, and the third nanoparticle 160*c* comprises a second metal nanoparticle. Other configurations of nanoparticles may be provided.

When nonvolatile memory cells are provided, the first and second electrode regions 110*a* and 110*b* can define a bit line and a data line, respectively, whereas the outer electrode region 170 can provide a word line. In some embodiments of nonvolatile memory cells, the first nanoparticle 160*a* is a first semiconductor nanoparticle, the second nanoparticle 160*b* is a metal nanoparticle and the third nanoparticle 160*c* is a second semiconductor nanoparticle. Other configurations of nanoparticles may be provided.

Figure 2:
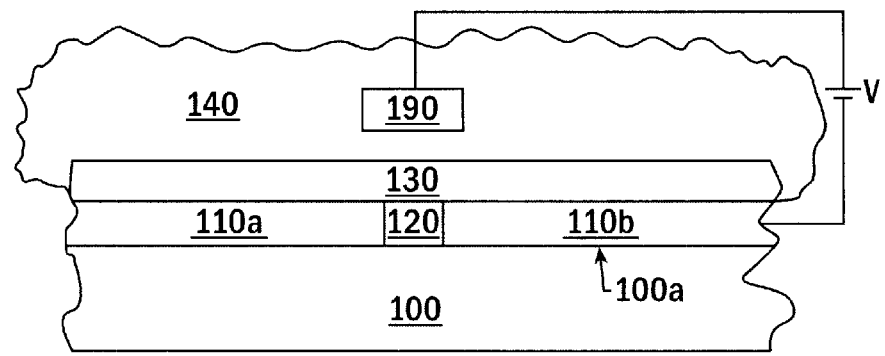

FIG. 2 is a cross-sectional view of alternate embodiments of single-electron devices during intermediate fabrication steps according to some embodiments of the present invention. In particular, embodiments of FIG. 2 may be used instead of embodiments of FIG. 1A. As shown in FIG. 2, a counter electrode 190 is provided that is adjacent and spaced apart from the spacer region 120. As also shown in FIG. 2, at least one of the spaced apart electrode regions 110*a* and 110*b*, and the counter electrode 190 is energized, to selectively wet etch the cover layer 130 adjacent the spacer region 120 and define a nanopore in the cover layer 130 adjacent the spacer region 120. In FIG. 2, a DC voltage V is applied between the counter electrode 190 and one or more the spaced apart electrode regions 110*a*, 110*b*. In other embodiments, the DC voltage V is applied between the counter electrode 190 and both of the spaced apart electrode regions 110*a*, 110*b*. The width of the nanopore that is formed, for example in FIG. 1B, can be a function of the magnitude of the DC voltage V, the time duration during which the DC voltage V is applied, the width of the spacer region 120, the thickness of the cover layer 130, the composition and/or concentration of the wet etching solution 140, and/or other parameters.

Figure 3A:
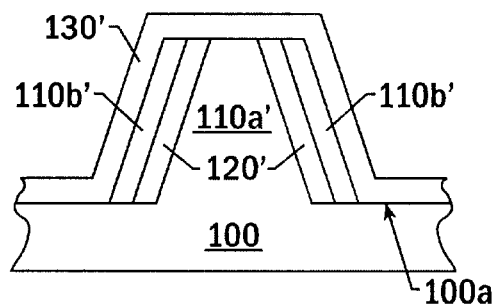
Figure 3B:
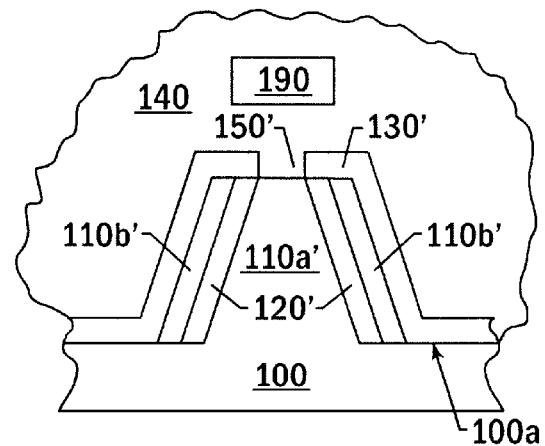

FIGS. 3A and 3B are cross-sectional views of other single-electron devices according to other embodiments of the present invention during intermediate fabrication steps according to other embodiments of the present invention. These embodiments can form single-electron transistors and provide fabrication methods in which the thickness of an insulating layer defines spacing between electrodes. In particular, referring to FIG. 3A, a first electrode region 110*a*' is provided that extends from the face 100*a* of a substrate 100. Embodiments of the first electrode region 110*a*' may be regarded as a post, tower, mesa, tip, pyramid or cone electrode region. A conformal insulating layer 120' on the sidewall of the first electrode region 110*a*' defines a spacer region 120'. A conformal second electrode region 110*b*' is provided on the conformal insulating layer 120' opposite the sidewall of the first electrode region 110*a*'. Accordingly, the conformal insulating layer defines a spacer region 120', the thickness of which defines the spacing between the first electrode region 110*a*' and the second electrode region 110*b*'. Structures of FIG. 3A, and fabrication methods therefor, as were described in this paragraph, are described extensively in the above-cited application Ser. No. 09/905,319. Accordingly, additional detailed description need not be provided herein.

Still referring to FIG. 3A, a cover layer 130' then is provided on the second electrode region 110*b*' on the end of the spacer region 120' and on the end of the first electrode region 110*a*'.

Referring now to FIG. 3B, according to some embodiments of the present invention, a counter electrode 190 is provided adjacent and spaced apart from the spacer region 120' and a wet etching solution 140 contacts the counter electrode 190 and the cover layer 130'. The first and second spaced apart electrode regions 110*a*' and/or 110*b*' and the counter electrode 190 are energized, to selectively wet etch the cover layer 130' adjacent the spacer region 120' and define a nanopore 150' in the cover layer 130' adjacent the spacer region 120'. One or more nanoparticles and/or outer electrodes may then be formed, as were described, for example, in connection with FIGS. 1C–1F.

Figure 4A:
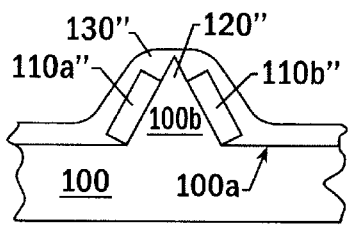
Figure 4B:
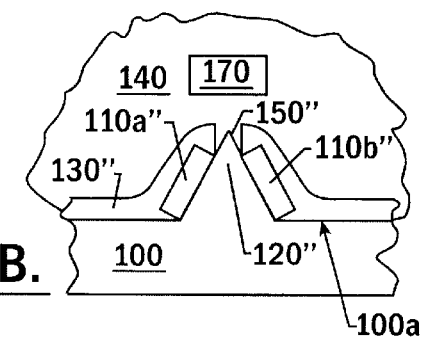

FIGS. 4A and 4B are cross-sectional views of still other single-electron devices according to still other embodiments of the present invention during intermediate fabrication steps according to still other embodiments of the present invention. More specifically, in FIG. 4A, a projecting feature 100*b* is formed on a substrate 100 that projects from a face 100*a* thereof. A first electrode region 110*a*" is formed on the projecting feature 100*b*. A second electrode region 110*b*" is formed on the projecting feature 100*b* and is spaced apart from the first electrode region 110*a*", such that the projecting feature 100*b* therebetween defines the spacer region 120". The structure and fabrication of single-electron devices as described in this paragraph are described extensively in the above-cited application Ser. No. 09/905,471. As such, additional detailed description need not be provided herein.

Continuing with the description of FIG. 4A, a cover layer 130" is formed on the first electrode region 110*a*", on the second electrode region 110*b*" and on the spacer region 120" therebetween. Referring to FIG. 4B, a counter electrode 190 is provided. The first and second electrode regions 110a",
110b" and the counter electrode 190 are energized while
contacting a wet etching solution 140, to define a nanopore
150" in the cover layer 130" adjacent the spacer region 120".
Devices then may be formed as were described in connection with FIGS. 1C–1F.

It will be understood that in FIGS. 4A and 4B, the
projecting feature 100b projects outwardly from the face
100a of the substrate 110. In contrast, in FIG. 5A, the
projecting feature 120''' projects inwardly into the substrate
100. The formation of the inwardly projecting-feature 120''',
the first electrode region 110a''' and the second electrode
region 110b''' also are described in the above-cited application Ser. No. 09/905,471, and need not be described in detail
herein.

Figure 5A:
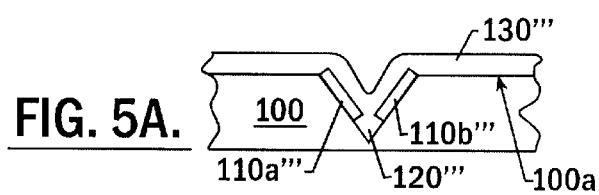
Figure 5B:
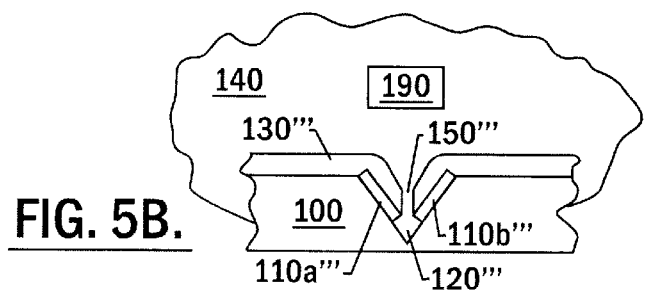

Then, as shown in FIG. 5A, a cover layer 130''' is formed.
Then, referring to FIG. 5B, a counter electrode 190 is
provided and the first and second electrode regions 110a'''
and 110b''' and the counter electrode 190 are contacted to a
wet etching solution 140, and selectively energized to define
a nanopore 150'''. Single-electron devices then may be
fabricated as were described in FIGS. 1C–1F.

Figure 6:
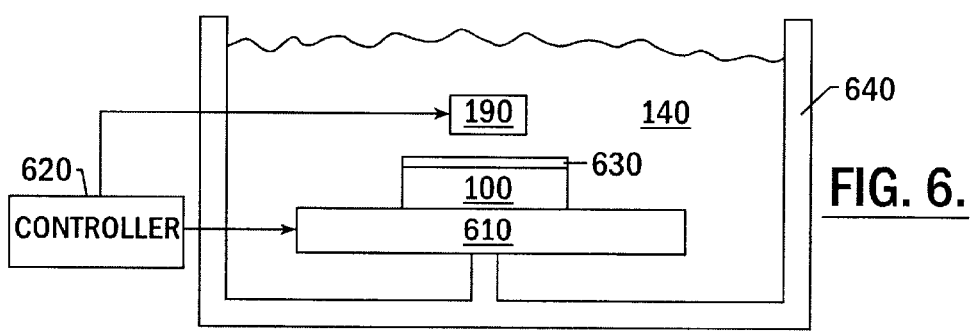
FIG. 6 is a cross-sectional view of systems for fabricating single electron devices, according to some embodiments of the present invention.

Systems for fabricating single-electron devices, according
to some embodiments of the present invention, now will be
described. FIG. 6 is a conceptual view of systems for
fabricating a single-electron device according to some
embodiments of the present invention. As shown in FIG. 6,
a substrate holder 610 is configured to hold a substrate 100
that includes a plurality of spaced apart electrode regions
with a spacer region therebetween and a cover layer 630 on
the spaced apart electrode regions and on the spacer region,
as was described in FIGS. 1A, 2, 3A, 4A and/or 5A above.
The cover layer 630 may correspond to the cover layer 130,
130', 130" and/or 130'''. A wet etching solution container 640
is configured to contact a wet etching solution 140 to the
cover layer 630 on the substrate 100. A controller 620 is
configured to energize at least one of the spaced apart
electrode regions, to selectively wet etch the cover layer 630
adjacent the spacer region and define a nanopore in the cover
layer adjacent the spacer region.

Still referring to FIG. 6, in still other embodiments of the
invention, a counter electrode 190 also is provided in the
container 640 that is adjacent and spaced apart from the
spacer region and that contacts the wet etching solution 140.
In these embodiments, the controller 620 is further configured to energize at least one of the spaced apart electrode
regions and the counter electrode 190, to selectively wet etch
the cover layer 630 adjacent the spacer region and define the
nanopore in the cover layer 630 adjacent the spacer region.
In yet other embodiments, another subsystem also may be
provided that is configured to place at least one nanoparticle
in the nanopore that is formed. In some embodiments, the
controller 620 applies an AC and/or a DC voltage. In other
embodiments, the controller can control the time, voltage
and/or voltage profile, to achieve the desired dimensions of
the nanopore.

Accordingly, embodiments of the present invention can
provide field strength dependent etching to define a nanopore that is aligned to a buried structure. In some
embodiments, the field strength dependent etching can provide a width of 1 nm per volt of applied voltage. Many
embodiments of single-electron devices may be fabricated
thereby, including single-electron transistors, chemically-gated single-electron transistors, resonant tunneling diodes,
nonvolatile memory devices and/or other devices.

In the drawings and specification, there have been disclosed typical preferred embodiments of the invention and,
although specific terms are employed, they are used in a
generic and descriptive sense only and not for purposes of
limitation, the scope of the invention being set forth in the
following claims.

What is claimed is:

1. A method of fabricating a single-electron device comprising:

providing on a substrate, a plurality of spaced apart
electrode regions, a spacer region therebetween and a
cover layer on the spaced apart electrode regions and
on the spacer region;

contacting a wet etching solution to the cover layer;

energizing at least one of the spaced apart electrode
regions to selectively wet etch the cover layer adjacent
the spacer region and define a nanopore in the cover
layer adjacent the spacer region; and placing at least one nanoparticle in the nanopore.

2. A method according to claim 1 wherein the spacer
region is less than about 20 nm thick and wherein the
nanopore is less than about 20 nm wide.

3. A method according to claim 1 wherein the contacting
comprises contacting an acid or a base etching solution to
the cover layer.

4. A method according to claim 3 wherein the base
solution comprises an amine, ethylene diamine and/or triethyl amine.

5. A method according to claim 3 wherein the acid
solution comprises sulfuric and/or phosphoric acid.

6. A method according to claim 3 wherein the etching
solution has a pH of less than about 14.

7. A method according to claim 1:

wherein the contacting comprises contacting a wet etching solution to the cover layer and to a counter electrode that is adjacent and spaced apart from the spacer
region; and wherein the energizing comprises energizing at least one
of the spaced apart electrode regions and the counter
electrode to selectively wet etch the cover layer adjacent the spacer region and define a nanopore in the
cover layer adjacent the spacer region.

8. A method according to claim 1 wherein the providing
comprises:

forming a first electrode on the substrate;

conformally forming an insulating layer on the first electrode; and conformally forming a second electrode on the insulating
layer opposite the first electrode, such that the first
electrode and the second electrode define the plurality
of spaced apart electrode regions and the insulating
layer therebetween defines the spacer region.

9. A method according to claim 1 wherein the providing
comprises:

forming a projecting feature on the substrate that projects
from a face thereof;

forming a first electrode on the projecting feature; and forming a second electrode on the projecting feature and
that is spaced apart from the first electrode, such that
the first electrode and the second electrode define the
plurality of spaced apart electrode regions and the
projecting feature therebetween defines the spacer
region.

10. A method according to claim 9 wherein the forming a
projecting feature comprises forming a projecting feature
that projects inwardly or outwardly from the face of the
substrate.

11. A method according to claim 1 further comprising:
forming an outer electrode region on the cover layer and extending across the nanopore.

12. A method according to claim 11 wherein the single-electron device is a single-electron transistor, wherein the plurality of spaced apart electrode regions define a source electrode and a drain electrode and wherein the outer electrode region defines a gate electrode.

13. A method according to claim 11 wherein the single-electron device is a resonant tunneling diode and wherein the plurality of spaced apart electrode regions are electrically connected together.

14. A method according to claim 11 wherein the single-electron device is a nonvolatile memory cell.

15. A method according to claim 12 wherein the at least one nanoparticle comprises at least one metal nanoparticle in the nanopore.

16. A method according to claim 13 wherein the at least one nanoparticle comprises a first metal nanoparticle in the nanopore adjacent the spacer region, a semiconductor nanoparticle in the nanopore on the first metal nanoparticle opposite the spacer region and a second metal nanoparticle in the nanopore on the semiconductor nanoparticle opposite the first metal nanoparticle.

17. A method according to claim 14 wherein the at least one nanoparticle comprises a first semiconductor nanoparticle in the nanopore adjacent the spacer region, a metal nanoparticle in the nanopore on the first semiconductor nanoparticle opposite the spacer region and a second semiconductor nanoparticle in the nanopore on the metal nanoparticle opposite the first semiconductor nanoparticle.

18. A method according to claim 1 wherein the nanopore is about 10 nm wide and about 10 nm thick.

19. A method according to claim 1 further comprising forming an analyte-specific binding agent on a surface of the at least one nanoparticle to provide a chemically gated single-electron transistor.

20. A method according to claim 1 wherein the energizing comprises placing a direct current voltage on at least one of the spaced apart electrode regions to selectively wet etch the cover layer adjacent the spacer region and define the nanopore in the cover layer adjacent the spacer region.

* * * * *